(12) United States Patent
Likhanskii et al.

(10) Patent No.: US 11,587,778 B2
(45) Date of Patent: Feb. 21, 2023

(54) ELECTRODYNAMIC MASS ANALYSIS WITH RF BIASED ION SOURCE

(71) Applicant: Applied Materials, Inc., Santa Clara, CA (US)

(72) Inventors: Alexandre Likhanskii, Malden, MA (US); Joseph C. Olson, Beverly, MA (US); Frank Sinclair, Boston, MA (US); Peter F. Kurunczi, Cambridge, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/088,443

(22) Filed: Nov. 3, 2020

(65) Prior Publication Data
US 2022/0139691 A1 May 5, 2022

(51) Int. Cl.
*H01J 49/36* (2006.01)
*H01J 49/06* (2006.01)
*H01J 37/317* (2006.01)
*H01J 49/10* (2006.01)

(52) U.S. Cl.
CPC .......... *H01J 49/36* (2013.01); *H01J 37/3171* (2013.01); *H01J 49/06* (2013.01); *H01J 49/105* (2013.01)

(58) Field of Classification Search
CPC .......... H01J 49/06; H01J 49/105; H01J 49/36; H01J 37/08; H01J 37/3171; H01J 37/2237; H01J 37/057; H01J 37/31701; H01J 37/31705
See application file for complete search history.

(56) References Cited

U.S. PATENT DOCUMENTS

| 4,739,170 A * | 4/1988 | Varga ............... H05H 1/14 315/111.81 |
| 10,068,758 B2 | 9/2018 | Likhanskii |
| 10,192,727 B2 | 1/2019 | Sinclair et al. |
| 10,763,072 B1 | 9/2020 | Sinclair et al. |
| 2001/0052455 A1 * | 12/2001 | Hong ............. H01J 37/3408 204/192.15 |
| 2017/0092473 A1 * | 3/2017 | Lee ............. H01J 37/32862 |
| 2018/0218894 A1 * | 8/2018 | Likhanskii ............. H01J 37/05 |
| 2018/0286653 A1 * | 10/2018 | Sinclair ............. H01J 49/22 |

* cited by examiner

*Primary Examiner* — David E Smith
(74) *Attorney, Agent, or Firm* — KDB Firm PLLC

(57) ABSTRACT

Provided herein are approaches for performing electrodynamic mass analysis with a radio frequency (RF) biased ion source to reduce ion beam energy spread. In some embodiments, a system may include an ion source including a power supply, the ion source operable to generate a plasma within a chamber housing, and an extraction power assembly including a first power supply and a second power supply electrically coupled with the chamber housing of the ion source, wherein the first power supply and the second power supply are operable to bias the chamber housing of the ion source with a time modulated voltage to extract an ion beam from the ion source. The system may further include an electrodynamic mass analysis (EDMA) assembly operable to receive the ion beam and perform mass analysis on the ion beam.

16 Claims, 5 Drawing Sheets

ELECTRODYNAMIC MASS ANALYSIS WITH RF BIASED ION SOURCE

FIELD OF THE DISCLOSURE

The disclosure relates generally to techniques for manufacturing electronic devices, and more particularly, to techniques for electrodynamic mass analysis with a radio frequency (RF) biased ion source to reduce ion beam energy spread.

BACKGROUND OF THE DISCLOSURE

Ion implantation is a process of introducing dopants or impurities into a substrate via bombardment. Ion implantation systems ("ion implanters") may comprise an ion source and a substrate stage or process chamber, housing a substrate to be implanted. The ion source may comprise a chamber where ions are generated. Beamline ion implanters may include a series of beam-line components, for example, a mass analyzer, a collimator, and various components to accelerate or decelerate the ion beam.

A useful function of an ion implanter beamline is to separate ions of different masses so that an ion beam may be formed having the desired ions for treating the work piece or substrate, while undesirable ions are intercepted in a beam-line component and do not reach the substrate. In known systems, this mass analysis function is provided by an analyzing magnet, which component bends a beam of ions that all have the same energy in a curve whose radius depends on the ion mass, thus achieving the required separation. Magnets of this kind, however, are large, expensive, and heavy and represent a significant portion of the cost and power consumption of an ion implanter.

For relatively lower energy ion implantation, such as energy below approximately 50 keV, compact ion beam systems have been developed. These ion beam systems may include a plasma chamber acting as ion source, placed adjacent a process chamber, which houses the substrate to be implanted. An ion beam may be extracted from the plasma chamber using an extraction grid or other extraction optics, and then provided to an electrodynamic mass analysis (EDMA) filter prior to being delivered to the substrate. However, existing EDMA approaches may introduce a large ion beam energy spread to achieve ion separation, which may also result in an increased beam angular spread at the substrate and increased beam strike at electrodes along the ion implanter beamline.

With respect to these and other considerations, the present disclosure is provided.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, a system may include an ion source including a power supply, the ion source operable to generate a plasma within a chamber housing, and an extraction power assembly including a first power supply and a second power supply electrically coupled with the chamber housing of the ion source, wherein the first power supply and the second power supply are operable to bias the chamber housing of the ion source with a time modulated voltage to extract an ion beam from the ion source. The system may further include an electrodynamic mass analysis (EDMA) assembly operable to receive the ion beam and perform mass analysis on the ion beam.

In another embodiment, an ion implantation system may include an ion source operable to generate a plasma within a chamber housing, and an extraction power assembly operable to bias the chamber housing to extract an ion beam from the ion source, the extraction power assembly including a radio frequency (RF) power supply and a direct current (DC) power supply electrically coupled with the chamber housing. The ion implantation system may further include an electrodynamic mass analysis (EDMA) assembly operable to receive the ion beam and perform mass analysis on the ion beam.

BRIEF DESCRIPTION OF THE DRAWINGS

By way of example, embodiments of the disclosure will now be described, with reference to the accompanying drawings, in which.

Figure 1:
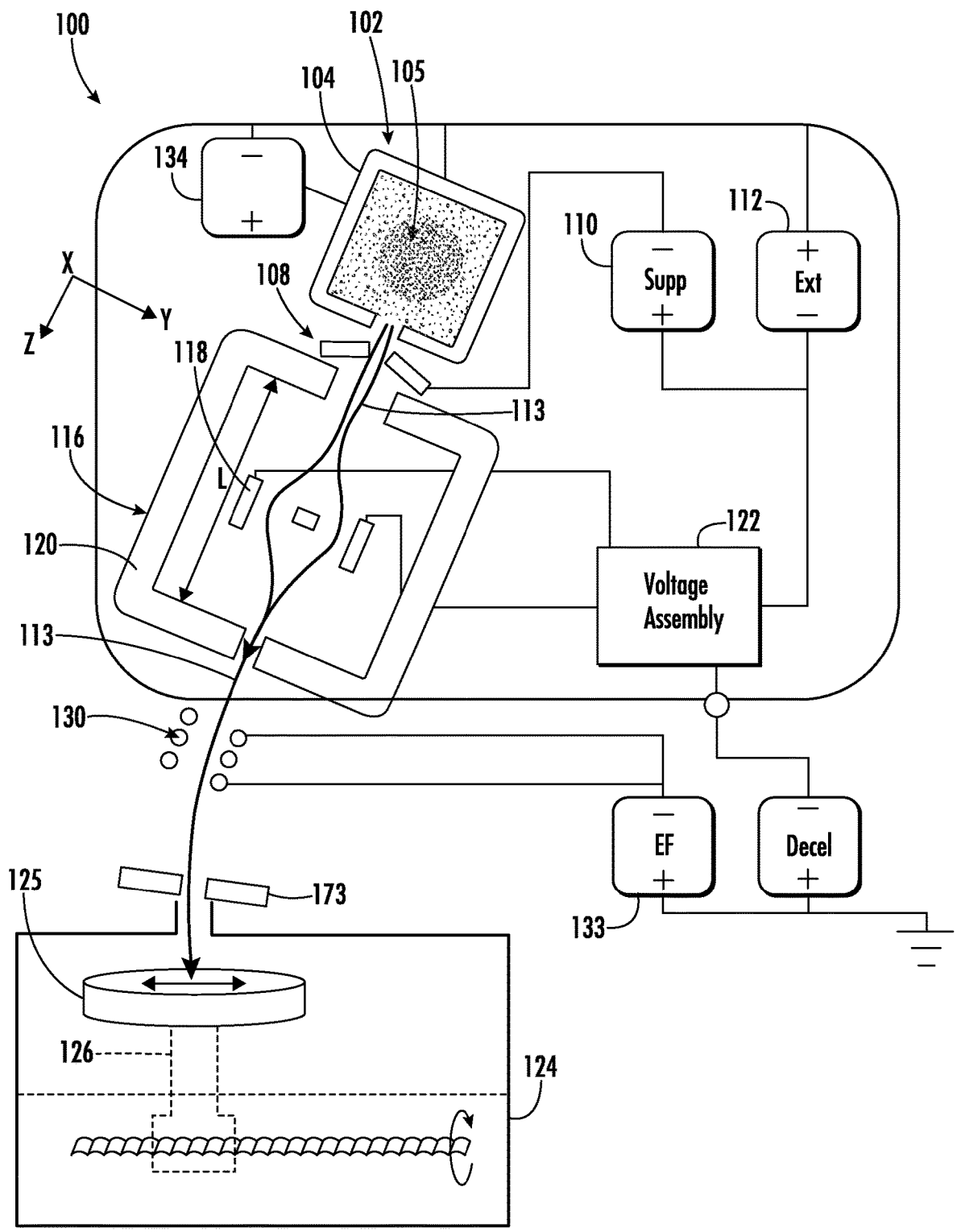
FIG. 1 is a schematic view illustrating an ion implantation system in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

An ion implantation system, ion source, and method in accordance with the present disclosure will now be described more fully hereinafter with reference to the accompanying drawings, where embodiments of the disclosure are shown. The ion implantation system, ion source, and method may be embodied in many different forms and are not be construed as being limited to the embodiments set forth herein. Instead, these embodiments are provided so this disclosure will be thorough and complete, and will fully convey the scope of the system and method to those skilled in the art.

In view of the foregoing deficiencies identified with the prior art, provided herein are approaches for reducing ion beam energy spread, improving mass separation capabilities of an electrodynamic mass analysis (EDMA) filter, eliminating beam strikes at electrodes of an electrostatic filter, and reducing angular ion spread at a wafer. In some approaches, the system may include RF or direct current (DC) ion source (such as ICP or IHC sources), ion extraction optics, the EDMA filter, and a plasma flood gun (PFG). As noted above, prior EDMA filters achieved ion separation, but introduced large ion energy spread (e.g., over 10 kV for 30 kV beam). In the present disclosure, as will be described in greater detail herein, to decrease energy spread, the system may determine an input energy distribution, which results in a minimum energy spread at an exit of the EDMA. In exemplary embodiments, biasing the ion source with a time modulated voltage to extract the ion beam from the ion source, rather than pure DC, advantageously reduces energy spread. In some embodiments, a pure sinusoidal signal+DC can be used for ion source biasing to produce an adequate energy distribution.

Referring now to FIG. 1, an exemplary ion implantation system (hereinafter "system") 100 in accordance with the present disclosure is shown. The system 100 may include an ion source 102 including a chamber housing 104 defining a plasma chamber for generating a plasma 105 therein. The system 100 may include extraction optics 108, coupled to a suppression power supply 110 and an extraction power assembly 112, to extract an ion beam 113, such as a ribbon beam (having a long axis along the X-axis).

The system may further include an EDMA assembly 116 having an electrode assembly 118 disposed therein, the EDMA assembly 116 disposed downstream of the extraction optics 108. An enclosure 120 of the EDMA assembly 116 is configured to receive the ion beam 113, wherein the ion beam 113 may include unanalyzed ions, and wherein targeted ions for implantation may be mixed with impurity ions. The enclosure 120 may be coupled to receive an RF voltage signal from RF voltage assembly 122 to perform mass analysis, as will be described in greater detail herein. Accordingly, a mass analyzed ion beam 113 is directed out of the enclosure 120.

The system 100 further includes a process chamber 124, disposed downstream of the enclosure 120, to receive the ion beam 113 and expose a substrate 125 thereto. In some embodiments, a substrate stage 126 may be provided in the process chamber 124 to scan the substrate 125 such that the entirety of the substrate 125 may be exposed to the ion beam.

As further shown, the system 100 may include an electrostatic filter 130 operable to filter out ions and energetic neutrals that do not have the targeted final ion energy. To accomplish this energy filtering, the electrostatic filter 130 may be coupled to an EF power supply 133, wherein the electrostatic filter 130 is arranged to deflect the ion beam from a first axis, such as the beam axis in the enclosure 120, to a process axis, which axis may be perpendicular to the plane of the substrate 125. As will be described in greater detail herein, the electrostatic filter 130 may include a plurality of electrodes and an accelerating or decelerating voltage to control the final energy of the mass analyzed, energy-filtered ion beam 113 before its provided to the substrate 125. In some embodiments, a plasma flood gun (PFG) 173 may be present between the electrodes of the electrostatic filter 130 and the substrate 125.

Figure 2:
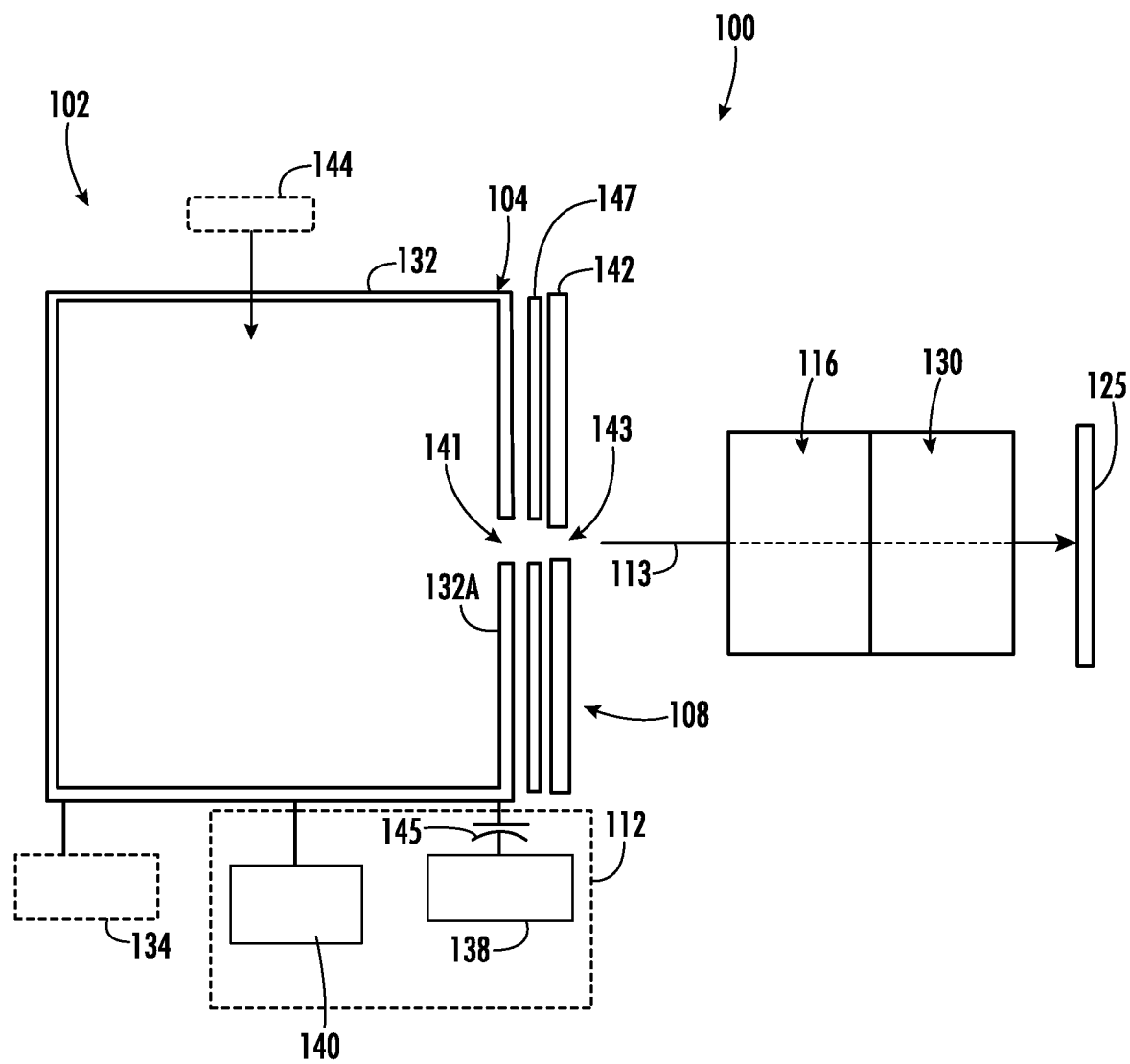
FIG. 2 a side cross-sectional view of the ion implantation system shown in FIG. 1 in accordance with embodiments of the present disclosure.

FIG. 2 shows a non-limiting embodiment of the ion source 102. The ion source 102 includes a plurality of walls 132 defining a chamber housing 104. In some embodiments, the ion source 102 may be an inductively coupled plasma (ICP) ion source including an RF antenna or RF coils (not shown) disposed against a dielectric window of the chamber housing) 104. The RF antenna/coils may be in electrical communication with a power supply 134 for generation of plasma within the chamber housing 104. In some embodiments, the power supply 134 may be an RF power supply 134 for supplying an RF voltage to the RF antenna/coils. Although non-limiting, the power supplied by the power supply 134 may be between 0.1 and 10 kW and may be any suitable frequency, such as between 1 and 15 MHz. Further, the power supplied by the power supply 134 may be pulsed.

In other embodiments, the plasma may be generated in a different manner, such as by a Bernas ion source, a capacitively coupled plasma (CCP) source, an indirectly heated cathode (IHC or another plasma source). In one example, the ion source 102 may be an IHC, while the power supply 134 is a DC power supply. However, the manner in which the plasma is generated is not limited by this disclosure.

During operation, the walls 132 of the chamber housing 104 may be electrically biased by the extraction power assembly 112. The bias voltage applied to the walls 132 establishes the potential of the plasma within the chamber housing 104. The difference between the electrical potential of the plasma and the electrical potential of the extraction optics 108 may help determine the energy that the extracted ions possess.

As shown, the extraction power assembly 112 may include a first power supply 138 and a second power supply 140 electrically coupled to the walls 132 of the chamber housing 104. In some embodiments, the first power supply 138 is a RF power supply, and the second power supply 140 is a DC power supply. Together, the first and second power supplies 138, 140 generate a time modulated voltage, which is used to extract the ion beam 113 from the ion source 102. In one non-limiting example, the ion beam 113 may enter the EDMA assembly 116 with Vdc+Vrf*sin(4πωt+φ) energy, wherein the voltage Vdc is provided by the second power supply 140 and voltage Vrf*sin(4πωt+φ) is provided by the first power supply 138, where Vrf is the amplitude of RF voltage, w is the frequency of EDMA filter operation, and φ is the phase shift between RF voltage of the first power supply 138 and RF voltage on the EDMA power supply. Specifically, Vdc can be 32.5 kV, Vrf can be 5 kV, ω can be 2 MHz and φ may be −4. In some embodiments, the frequency of RF biasing the ion source 102 is twice the frequency of RF voltage of the EDMA assembly 116. Embodiments herein are not limited in this context, however.

The ion beam 113 may be decelerated in the electrostatic filter 130 to, e.g., a 5 kV final energy at the substrate 125. The combination of RF+DC to extract the ion beam from the ion source 102, rather than pure DC, causes the energy spread of the ion beam 113 to be reduced before entering the EDMA assembly 116. Furthermore, the extraction power assembly 112 can fine tune the waveform at the ion source 102 to minimize the energy spread. In one example, for simplicity, pure sinusoidal signal+DC can be used for biasing the chamber housing 104 to get a desired energy distribution. In another example, the oscillating function may be not be sine, but another shape oscillating with the same frequency.

In some embodiments, the first power supply 138 supplies an RF voltage to the chamber walls 132 through a blocking capacitor 145. The RF voltage output from the first power supply 138 may be in the form: $V_{bias} = V_0 \sin(4\pi\omega t)$, where $V_0$ is the amplitude of the bias voltage and ω is the frequency of the bias voltage. Once enabled, the ion source 102 will develop an average positive potential, referred to as the self-bias voltage. This self-bias voltage is typically a positive value.

As further shown, the chamber housing 104 may include an extraction plate 132A including an extraction aperture 141. The extraction aperture 141 may be an opening through which the ions generated in the chamber housing 104 are extracted and directed towards the substrate 125. The extraction aperture 141 may be any suitable shape. In certain embodiments, the extraction aperture 141 may be oval or rectangular shaped, having one dimension, referred to as the length, which may be much larger than the second dimension, referred to as the height. In certain embodiments, the length of the extraction aperture 141 may be as large as two meters or more. In certain embodiments, all of the chamber walls 132 and the extraction plate 132A are electrically conductive. In other embodiments, only the extraction plate 132A is electrically conductive and in communication with the extraction power assembly 112. The remaining chamber walls 132 may be made of a dielectric material. Although non-limiting, the extraction power assembly 112 may bias the chamber walls 132 and the extraction plate 132A at a voltage of between 0.5 kV and 50 kV, and a frequency of between 0.1 and 50 MHz.

Disposed outside and proximate the extraction aperture 141 are the extraction optics 108. In certain embodiments, the extraction optics 108 may include a suppression electrode 147 adjacent a ground electrode 142, which may be a single electrically conductive component with a ground aperture 143 disposed therein. Alternatively, the ground electrode 142 may be comprised of two electrically conductive components that are spaced apart so as to create the ground aperture 143 therebetween. The ground electrode 142 may be a metal, such as titanium. The ground electrode 142 may be electrically connected to ground. In some embodiments, the ground electrode 142 may be biased using a separate power supply. As shown, the extraction aperture 141 and the ground aperture 143 are aligned to deliver the ion beam 113 to the EDMA assembly 116.

In other embodiments, the extraction optics 108 may be more complex. For example, the extraction optics 108 may include one or more additional electrodes. There may be one or more electrodes that are disposed between the extraction plate 132A and the ground electrode 142. In other embodiments, there may be one or more electrodes disposed between the ground electrode 142 and the EDMA assembly 116. The configuration of the extraction optics 108 may vary and is not limited by this disclosure In operation, feed gas from a gas storage container 144 is introduced to the ion source 102. The power supply 134 may then energize RF coils of the ion source 102, exiting the feed gas and causing the creation of a plasma. Ions in that plasma are typically positively charged. Because the ground electrode 142 is more negatively biased than the chamber walls 132 and the extraction plate 132A, the ions exit the extraction aperture 141 in the form of the ion beam 113 in response to the time-modulated voltage signal from the extraction power assembly 112. The ion beam 113 passes through the extraction aperture 141, the ground aperture 143, the EDMA assembly 116, and the electrostatic filter 130, and travels toward the substrate 125.

In various embodiments, different species may be used for the feed gas. Examples may include atomic or molecular species containing boron (B), carbon (C), oxygen (O), germanium (Ge), phosphorus (P), arsenic (As), silicon (Si), helium (He), neon (Ne), argon (Ar), krypton (Kr), nitrogen (N), hydrogen (H), fluorine (F), chlorine (Cl), aluminum (Al), antimony (Sb), Indium (In), Carborane, and Naphthalene. Those of ordinary skill in the art will recognize the above listed species are non-limiting, and other atomic or molecular species may also be used. Depending on the application(s), the species may be used as the dopants or the additional material. In particular, one species used as the dopants in one application may be used as the additional material in another application, or vice-versa.

Figure 3:
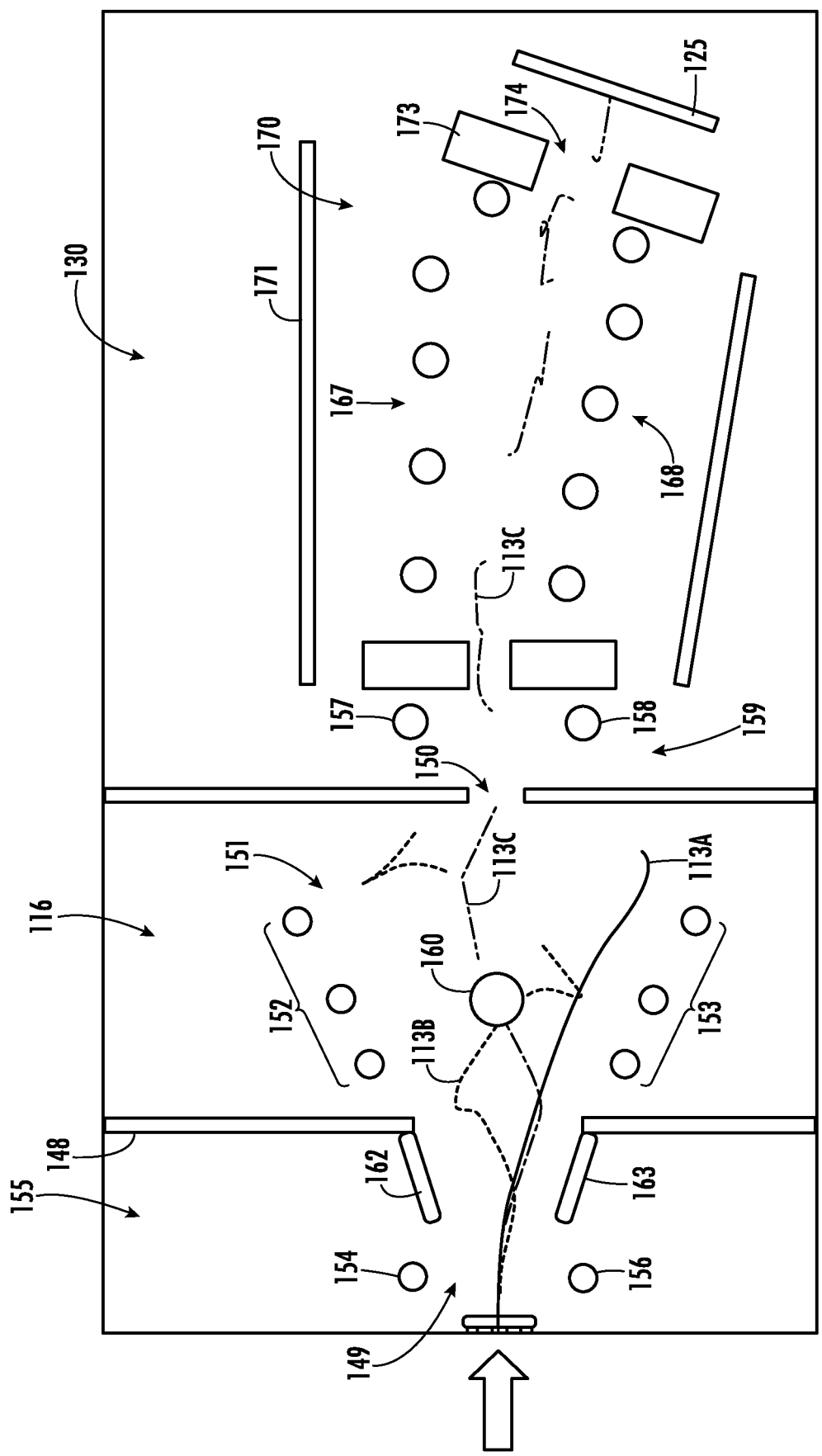
FIG. 3 is a side cross-sectional view of an EDMA filter and electrostatic filter in accordance with embodiments of the present disclosure.

Referring now to FIG. 3, operation of the EDMA assembly 116 and the electrostatic filter 130 according to embodiments of the present disclosure will be described in greater detail. As shown, the electrostatic filter 130 may include a chamber 170 defined by a chamber housing 171. Within the chamber housing 171 is a first plurality of electrodes 167 disposed along one side of the ion beam 113C, and a second plurality of electrodes 168 disposed along a second side of the ion beam 113C.

The electrostatic filter 130 may be bordered along one end by a plasma flood gun (PFG) 173, which has an opening 174 to permit the ion beam 113C to pass therethrough to the substrate/wafer 125. As shown, the PFG 173 is between the first and second plurality of electrodes 167, 168 and the substrate/wafer 125. In some embodiments, the PFG 173 and the substrate/wafer 125 are oriented at an angle relative to an ion beam-line/trajectory. Although non-limiting, the angle may be between 5-30°. Due to the arrangement of the first and second plurality of electrodes 167, 168 relative to the PFG 173 and to the substrate/wafer 125, the electrostatic filter 130 may be considered "curved". Embodiments herein are not limited in this context, however.

In some embodiments, the first and second plurality of electrodes 167, 168 may be graphite rods disposed along the ion beam-line/trajectory. Although non-limiting, the first and second plurality of electrodes 167, 168 may include one or more entrance electrodes, a set of suppression electrodes, one or more focusing electrodes, and a set of exit electrodes to deflect, decelerate, accelerate, converge, or diverge the ion beam 113C passing therethrough. As shown, each set of electrode pairs provides a space/opening for the ion beam 113C.

In exemplary embodiments, the first and second plurality of electrodes 167, 168 include pairs of conductive pieces electrically coupled to one another. Alternatively, the first and second plurality of electrodes 167, 168 may be a series of unitary structures each including an aperture for the ion beam 113C to pass therethrough. In the embodiment shown, upper and lower portions of each electrode pair may have different potentials (e.g., in separate conductive pieces).

In some embodiments, the EF power supply 133 (FIG. 1), such as a DC power supply, supplies a voltage and a current to the electrostatic filter 130. For example, the voltage/current may be supplied to first and second plurality of electrodes 167, 168 to generate a plasma within the electrostatic filter 130. In various embodiments, the voltage and current may be constant or varied. Furthermore, the first and second plurality of electrodes 167, 168 may be electrically driven in parallel (e.g., individually) or in series to enable uniform and/or independent operation of each of the first and second plurality of electrodes 167, 168. For example, the voltage for one or more suppression electrodes may be increased relative to the remaining electrodes to manage convergence and divergence of the ion beam 113. In other embodiments, each of the first and second plurality of electrodes 167, 168 has a different voltage.

The EDMA assembly 116, which acts as a mass filter, may include a housing or enclosure 148 having an entrance aperture 149 to receive the ion beam 113, as well as an exit aperture 150 disposed downstream to the entrance aperture 149. The entrance aperture 149 and the exit aperture 150 may define a beam axis, extending therebetween.

During operation, the EDMA assembly 116 may be operated in a manner where select ions of a desired mass enter through entrance aperture 149 having trajectories generally parallel to the beam axis and exit through the exit aperture 150 generally parallel to the beam axis, while being deflected along different trajectories within an interior 151 of the EDMA assembly 116. To perform mass analysis, the EDMA assembly 116 may include an upper electrode set 152, disposed above the beam axis, and a lower electrode set 153, disposed below the beam axis. In some embodiments, the upper electrode set 152 and the lower electrode set 153 may include a plurality of electrodes arranged in a flared relationship, wherein a separation distance between the upper electrode set 152 and the lower electrode set 153 increases between the entrance aperture 149 and the exit aperture 150. This flared relationship may aid in reducing ion impacts from the ion beam 113 traveling through the enclosure 148.

In some embodiments, the EDMA assembly 116 may further include an upper entrance electrode 154 and a lower entrance electrode 156, disposed in an entrance chamber 155. The EDMA assembly 116 may further include an upper exit electrode 157 and a lower exit electrode 158, disposed in an exit chamber 159. As shown, the EDMA assembly 116 may also include a beam blocker 160, disposed between the upper electrode set 152 and the lower electrode set 153, and extending across the beam axis. In some embodiments, the beam blocker 160 may be set at ground potential.

The EDMA assembly 116 may include a ground tunnel in the entrance chamber 155, disposed downstream of the upper entrance electrode 154 and the lower entrance electrode 156. As shown, the ground tunnel may include an upper portion 162 disposed above the beam axis, and a lower portion 163 disposed below the beam axis. In various embodiments, the ground tunnel may also be characterized by a flared shape.

FIG. 3 demonstrates three non-limiting ion beams 113A-113C entering the EDMA assembly 116 with 32.5 kV+5 kV*sin(4πωt−4) energy, for example. Ion beam 113A may correspond to H3+ ions, ion beam 113B may correspond to BF2+ ions, and ion beam 113C may correspond to B+ ions. As shown, ion beams 113A and 113B are filtered before reaching the electrostatic filter 130, while ion beam 113C passes into and through the electrostatic filter 130. As a result of the small energy spread of ion beam 113C exiting the EDMA assembly 116, energy spread of the ion beam 113C at the wafer/substrate 125 is also relatively small, e.g., ~3.5-4 kV. EDMA operation frequency ω was 2 MHz in this example. Additional benefits are a small angular spread at the wafer/substrate 125 and no, or fewer, beam strikes at the first and second plurality of electrodes 167, 168.

In some embodiments, the ions of ion beams 113A and 113B may have a different mass than the mass of the process ions of ion beam 113C. By appropriate selection of various parameters, the ions of ion beams 113A and 113B may be deflected along trajectories that cause these ions to be captured within the enclosure 148, or may be caused to exit through exit aperture 150 along trajectories that are not parallel to the beam axis, and thus do not strike the substrate 125. The various parameters may include voltage amplitude as well as the geometrical arrangement of various components, such as the upper electrode set 152 and the lower electrode set 153, within the enclosure 148.

Figure 4:
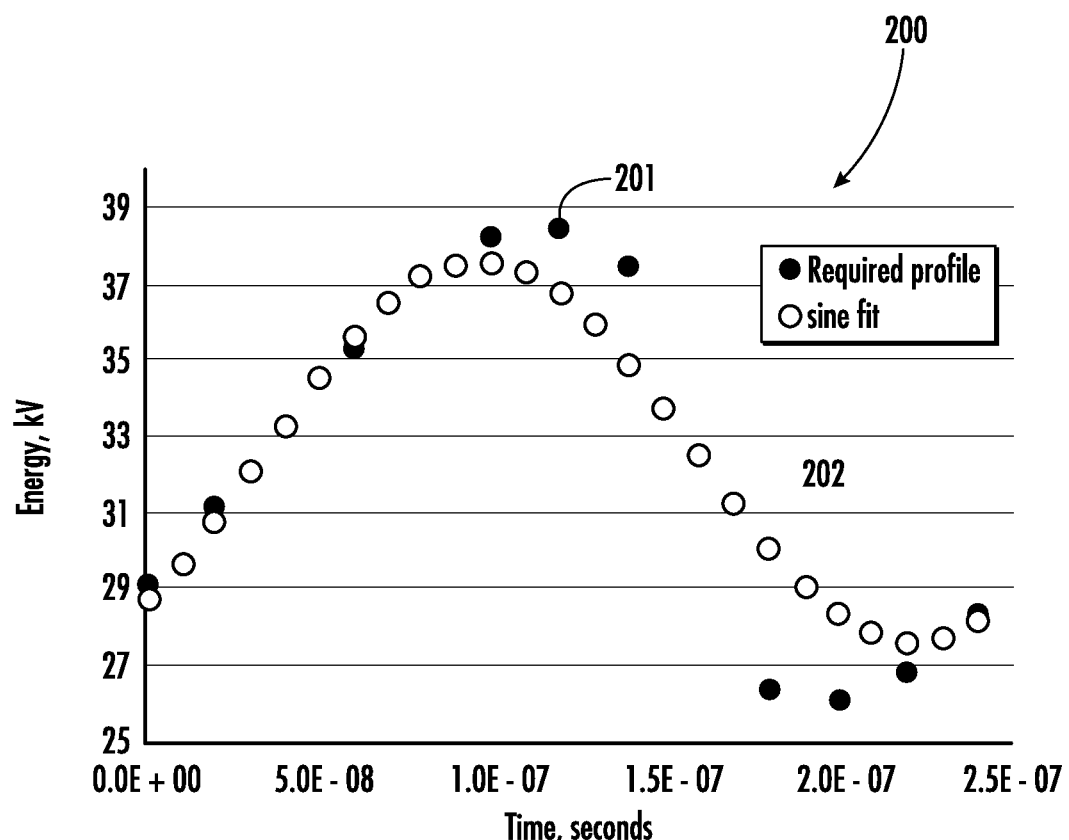
FIG. 4 is a graph illustrating an example input energy distribution vs. time in accordance with embodiments of the present disclosure.

The graph 200 of FIG. 4 demonstrates what input energy distribution will give a minimum energy spread at the exit aperture 150 of the EDMA assembly 116. A first set of data results 201 demonstrate a periodic function with twice the frequency of the EDMA assembly 116. This function can be approximated with the sine fit 202. In general, if the ion source 102 is biased with a time modulated voltage, rather than pure DC, the energy spread will advantageously be reduced.

In one non-limiting example, an energy spread of a B+ beam after the EDMA assembly 116 may be reduced when, for example, the input beam energy is changed from 30 kV DC to 32.5 kV+5 kV*sin(4πωt−4). The energy spread may be reduced for the DC input beam, for example, by a factor of two (2) or by a factor of four (4). Furthermore, the modified input beam advantageously results in the elimination of low energy components of the ion beam, which may also be beneficial in terms of space charge effects and productivity of the EDMA assembly 116.

Figure 5:
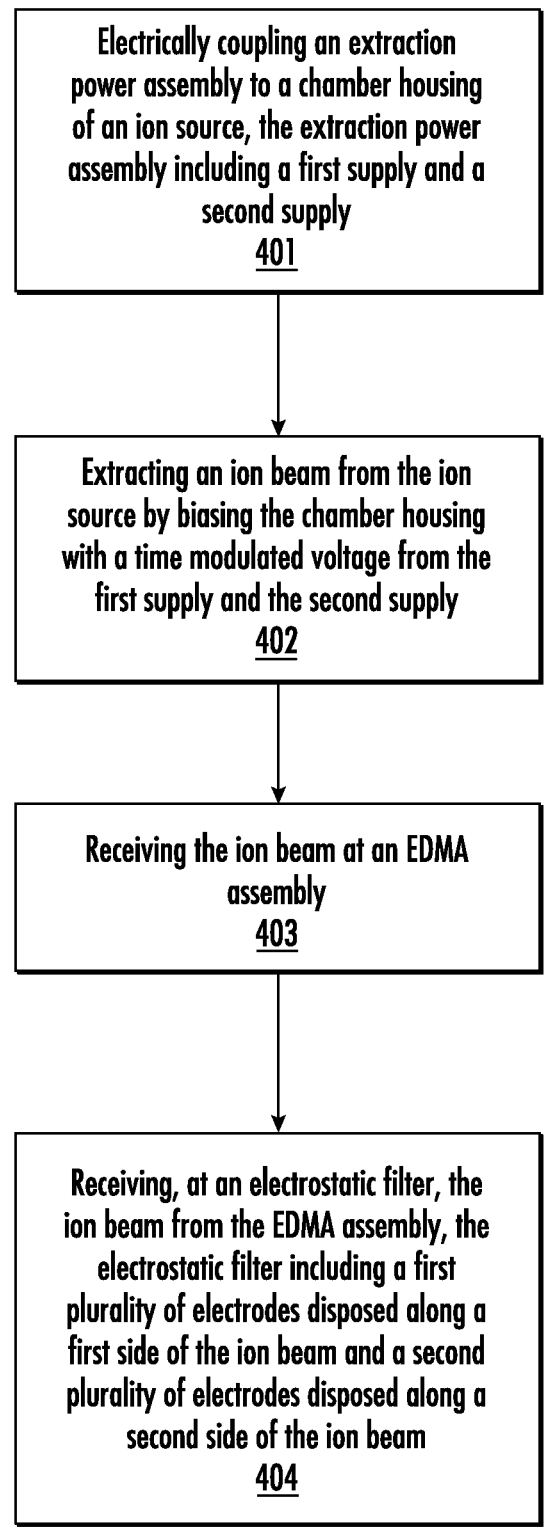
FIG. 5 is a flowchart illustrating an exemplary method according to the present disclosure.

Referring now to FIG. 5, a flow diagram illustrating an exemplary method 400 in accordance with the present disclosure is shown. At block 401, the method 400 may include electrically coupling an extraction power assembly to a chamber housing of an ion source, the extraction power assembly including a first power supply and a second power supply. In some embodiments, an RF voltage is generated from the first power supply and a DC voltage is generated from the second power supply.

In some embodiments, the method 400 may include generating a plasma within the chamber housing of the ion source. In some embodiments, the method 400 may include electrically coupling a power supply to the ion source, wherein the power supply is operable to generate the plasma. In some embodiments, the ion source may be an inductively coupled plasma (ICP) ion source including an RF antenna or RF coils disposed against a window of the chamber housing. The RF antenna/coils may be in electrical communication with the power supply for generation of plasma within the chamber housing. In some embodiments, the power supply may be an RF power supply for supplying an RF voltage to the RF antenna/coils.

At block 402, the method 400 may include extracting an ion beam from the ion source by biasing the chamber housing with a time modulated voltage from the first supply and the second supply. In some embodiments, biasing the ion source with the time modulated voltage, rather than pure DC, advantageously reduces energy spread of the ion beam as it exits an EDMA assembly. In some embodiments, a pure sinusoidal signal+DC can be used for ion source biasing to produce an adequate energy distribution.

At block 403, the method 400 may include receiving the ion beam at the EDMA assembly. In some embodiments, the EDMA assembly may include a first set of electrodes disposed along a first side of the ion beam and a second set of electrodes disposed along a second side of the ion beam. In some embodiments, an enclosure of the EDMA assembly may be coupled to receive an RF voltage signal from an RF voltage assembly, to perform mass analysis of ions of the ion beam.

At block 404, the method 400 may include receiving, at an electrostatic filter, the ion beam from the EDMA assembly, the electrostatic filter including a first plurality of electrodes disposed along a first side of the ion beam and a second plurality of electrodes disposed along a second side of the ion beam. In some embodiments, the first and second plurality of electrodes may be graphite electrode rods disposed along the ion beam-line/trajectory. In some embodiments, the first and second plurality of electrodes may include one or more entrance electrodes, a set of suppression electrodes, one or more focusing electrodes, and a set of exit electrodes, wherein the electrodes are collectively configured to deflect, decelerate, accelerate, converge, or diverge the ion beam passing therethrough. In some embodiments, the ion beam may pass through a plasma flood gun on its way to a substrate/wafer.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. However, it should be understood that various features of the certain aspects, embodiments, or configurations of the disclosure may be combined in alternate aspects, embodiments, or configurations. Moreover, the following claims are hereby incorporated into this Detailed Description by this reference, with each claim standing on its own as a separate embodiment of the present disclosure.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Furthermore, identification references (e.g., primary, secondary, first, second, third, fourth, etc.) are not intended to connote importance or priority, but are used to distinguish one feature from another. The drawings are for purposes of illustration only and the dimensions, positions, order and relative sizes reflected in the drawings attached hereto may vary.

Still furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

What is claimed is:

1. A system, comprising:
   an ion source including a power supply, the ion source operable to generate a plasma within a chamber housing;
   an extraction power assembly including a first power supply and a second power supply each independently and directly electrically coupled with the chamber housing of the ion source, wherein the first power supply and the second power supply are operable to bias the chamber housing of the ion source with a time modulated voltage to extract an ion beam from the ion source;
   an electrodynamic mass analysis (EDMA) assembly operable to receive the ion beam, and perform mass analysis on the ion beam; and
   an electrostatic filter positioned downstream of the EDMA assembly, the electrostatic filter operable to receive the ion beam directly from the EDMA assembly, the electrostatic filter including a first plurality of electrodes disposed along a first side of the ion beam and a second plurality of electrodes disposed along a second side of the ion beam.

2. The system of claim 1, wherein the first power supply is a radio frequency (RF) power supply, and wherein the second power supply is a direct current (DC) power supply.

3. The system of claim 2, wherein the power supply is an RF power supply, and wherein the ion source is an inductively coupled plasma ion source.

4. The system of claim 1, the EDMA assembly comprising an enclosure operable to receive an RF voltage signal from an RF voltage assembly to perform mass analysis on the ion beam.

5. The system of claim 1, wherein the ion beam entering the EDMA assembly has a first ion beam energy spread, wherein the ion beam exiting the EDMA assembly has a second ion beam energy spread, and wherein the second ion beam energy spread is less than the first ion beam energy spread.

6. The system of claim 5, wherein the first ion beam energy spread is at least two times greater than the second ion beam energy spread.

7. The system of claim 5, wherein the first ion beam energy spread is at least four times greater than the second ion beam energy spread.

8. The system of claim 1, further comprising a set of extraction optics disposed between the ion source and the EDMA assembly.

9. The system of claim 8, wherein the set of extraction optics comprises a suppression electrode adjacent a ground electrode, and wherein the ion beam is received at the EDMA assembly from the ground electrode.

10. An ion implantation system, comprising:
    an ion source including a first radio frequency (RF) power supply operable to generate a plasma within a chamber housing;

an extraction power assembly operable to bias the chamber housing to extract an ion beam from the ion source, the extraction power assembly including a second (RF) power supply and a direct current (DC) power supply each independently and directly electrically coupled with the chamber housing;

an electrodynamic mass analysis (EDMA) assembly operable to receive the ion beam and perform mass analysis on the ion beam; and an electrostatic filter operable to receive the ion beam directly from the EDMA assembly, the electrostatic filter including a first plurality of electrodes disposed along a first side of the ion beam and a second plurality of electrodes disposed along a second side of the ion beam.

11. The ion implantation system of claim 10, wherein the ion source is an inductively coupled plasma ion source.

12. The ion implantation system of claim 10, the EDMA assembly comprising:

an enclosure operable to receive an RF voltage signal from an RF voltage assembly to perform mass analysis on the ion beam; and a first set of electrodes and a second set of electrodes within the enclosure, wherein the first set of electrodes is disposed along a first side of the ion beam and the second set of electrodes is disposed along a second side of the ion beam.

13. The system of claim 10, wherein the ion beam entering the EDMA assembly has a first ion beam energy spread, wherein the ion beam exiting the EMDA assembly has a second ion beam energy spread, and wherein the second ion beam energy spread is less than the first ion beam energy spread.

14. The system of claim 13, wherein the first ion beam energy spread is at least two times greater than the second ion beam energy spread.

15. The system of claim 13, wherein the first ion beam energy spread is at least four times greater than the second ion beam energy spread.

16. The system of claim 10, further comprising a set of extraction optics disposed between the ion source and the EDMA assembly.

* * * * *